United States Patent [19]

Rhodes et al.

[11] Patent Number: 5,234,855

[45] Date of Patent: * Aug. 10, 1993

[54] STACKED COMB SPACER CAPACITOR

[75] Inventors: Howard E. Rhodes; Hiang C. Chan; Charles H. Dennison; Yauh-Ching Liu; Pierre C. Fazan; Gurtej S. Sandhu, all of Boise, Id.

[73] Assignee: Micron Technology, Inc., Boise, Id.

[*] Notice: The portion of the term of this patent subsequent to Mar. 31, 2009 has been disclaimed.

[21] Appl. No.: 633,595

[22] Filed: Dec. 21, 1990

[51] Int. Cl.[5] .................. H01L 21/70; H01L 21/265
[52] U.S. Cl. ........................ 437/47; 437/52; 437/235; 437/919
[58] Field of Search ............... 437/47, 48, 52, 60, 437/919; 357/23.6, 51; 365/149

[56] References Cited

U.S. PATENT DOCUMENTS

| | | | |
|---|---|---|---|
| 5,030,585 | 7/1991 | Gonzalez et al. | 437/52 |
| 5,049,957 | 9/1991 | Inoue et al. | 437/52 |
| 5,071,781 | 12/1991 | Seo et al. | 437/47 |
| 5,100,825 | 3/1992 | Fazan et al. | 437/47 |

OTHER PUBLICATIONS

"3-Dimensional Stacked Capacitor Cell for 16M and 64M DRAMs." by T. Ema, et al., pp. 592-595, 1988.
"A Spread Stacked Capacitor (SSC) Cell for 64MBIT DRAMs" by S. Inoue et al. pp. 31-34, IEDM 89'1989.

Primary Examiner—Olik Chaudhuri
Assistant Examiner—Loc Q. Trinh
Attorney, Agent, or Firm—David J. Paul

[57] ABSTRACT

A stacked comb spacer capacitor (SCSC) using a modified stacked capacitor storage cell fabrication process. The SCSC is made up of polysilicon structure, having a spiked v-shaped (or comb-shaped) cross-section, located at a buried contact and extending to an adjacent storage node overlaid by polysilicon with a dielectric sandwiched in between. The creation of the spiked polysilicon structure increases storage capability 50% without enlarging the surface area defined for a normal buried digit line stacked capacitor cell. Removing the dielectric residing under the backside of the storage node cell plate and filling that area with polysilicon increases storage capacity by an additional 50% or more.

20 Claims, 12 Drawing Sheets

STACKED COMB SPACER CAPACITOR

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

As is the case for most semiconductor integrated circuitry, circuit density for DRAM arrays is continuing to increase at a fairly constant rate. In DRAM arrays, it is essential that a storage node capacitor cell plate be large enough to retain an adequate charge or capacitance in spite of parasitic capacitances and noise that may be present during circuit operation. Hence, the ability to densely pack DRAM cells, while maintaining required storage capabilities, is a crucial requirement of semiconductor manufacturing technology if future generations of such memory arrays are to be successfully manufactured.

One method of maintaining, as well as increasing, storage node size in densely packed memory devices is through the use of a "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3 - DIMENSIONAL STACKED CAPACITOR CELL FOR 16M AND 64M DRAMS," IEDM, Dig. Tech. Papers, pp. 592-595, 1988, herein incorporated by reference, discusses a 3 - dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64 MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked comb spacer capacitor (SCSC) defined as a storage cell.

After a silicon wafer is prepared using conventional process steps, the present invention develops the SCSC by creating a poly structure having a spiked v-shaped cross-section, formed by additional poly spacer walls. The SCSC conforms to the topology formed by three adjacent word lines running perpendicular to two adjacent digit lines, resulting in increased capacitor plate surface area for each storage cell. Such a structure has the potential to increase the capacitance of a conventional STC cell by 50% or more, depending on the number of spacer walls created within an individual cell, coupled with the spacer wall height.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1-10b.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
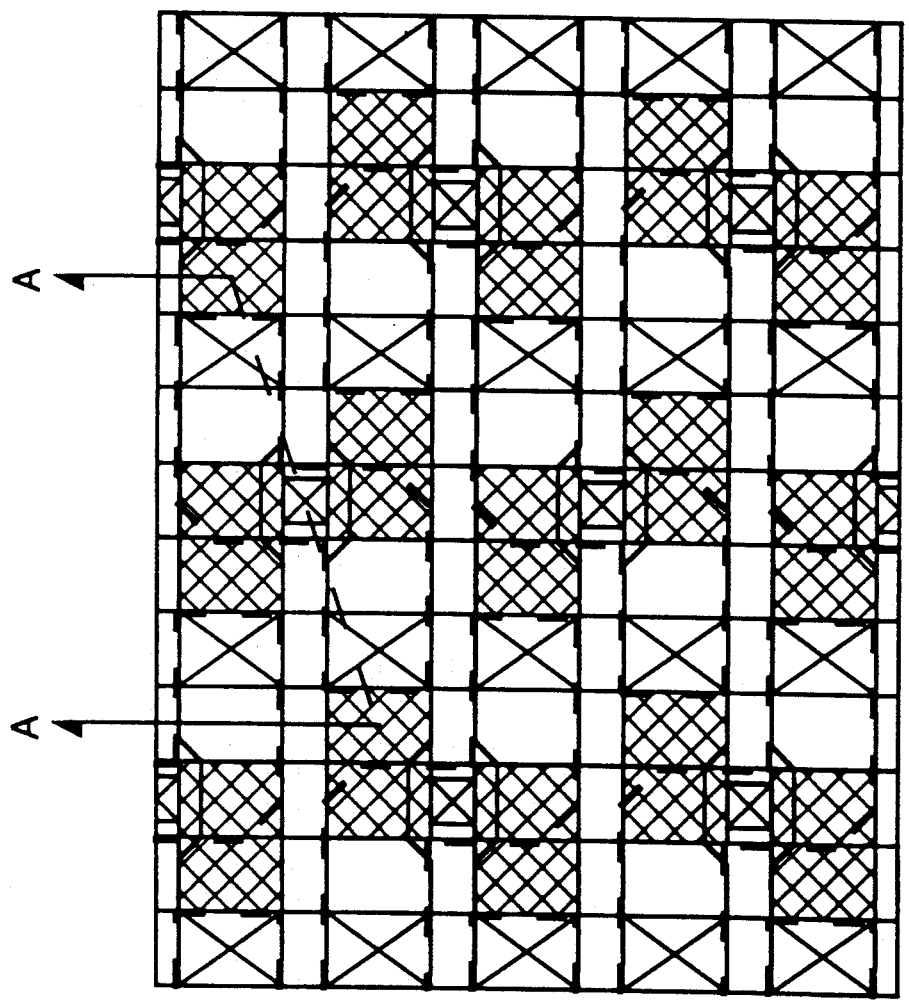
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines, word lines, active area, and an SCSC. The stacked capacitor structure of the preferred embodiment (the SCSC) is self-aligned to word lines as well as to digit lines.

Figure 2:
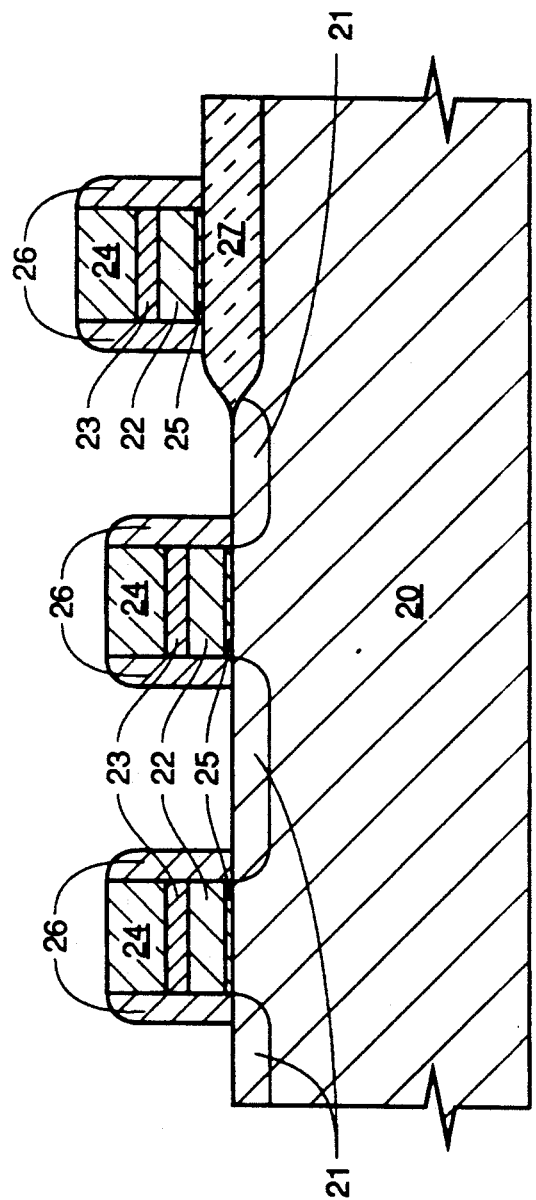
FIG. 2 is a cross-sectional view through broken line A—A of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 22.

Figure 3:
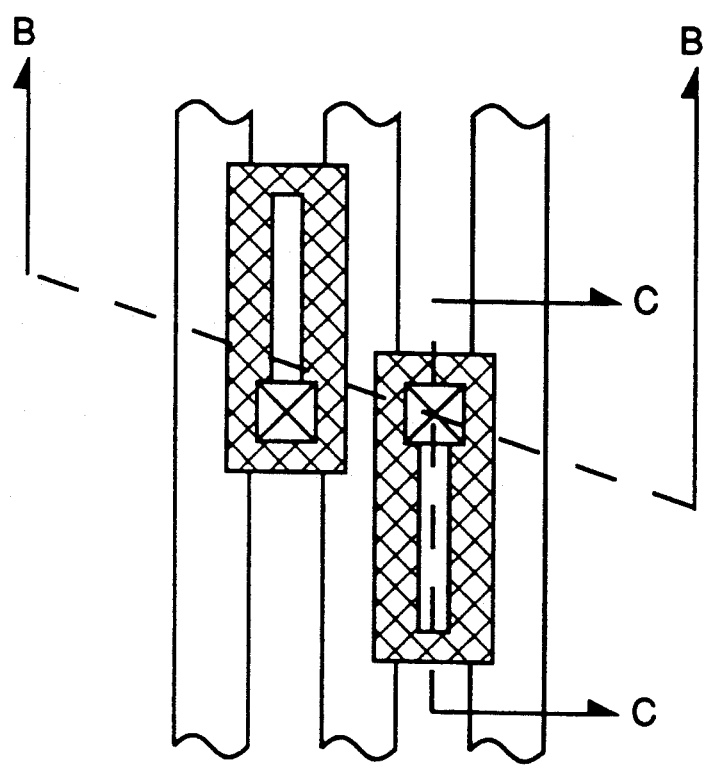
FIG. 3 is a top planar view of a portion of an in-process wafer showing digit lines, storage node contacts and storage capacitors.

FIG. 3 shows a top planar view portion of an in-process wafer showing digit lines, storage node contacts and storage capacitors.

Figure 4:
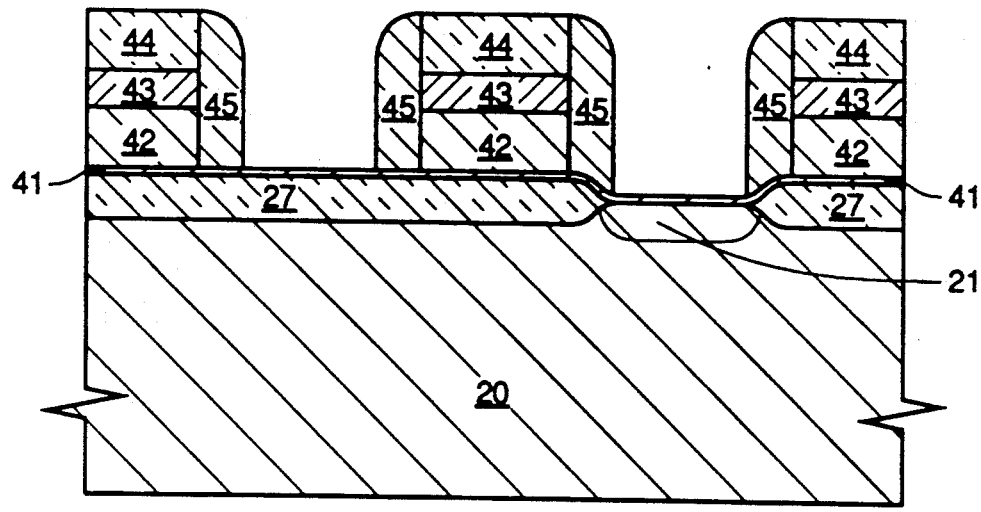
FIG. 4 is a cross-sectional view of the in-process wafer through broken line B—B of FIG. 3 following deposition and etching of digit line vertical dielectric spacers.

As shown in FIG. 4, an oxide layer 41 is deposited over the entire wafer array surface followed by buried digit line contacts patterning and etch. Following the etching of the digit line buried contact, blanket depositions of polysilicon 42, silicide 43 and dielectric 44 are performed respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to and over the top of word lines 22 (shown in FIG. 2) and conform to the wafer surface resulting in a waveform-like topology running in both the digit line and word line directions. A second dielectric 45, such as nitride or oxide is now deposited, followed by an anisotropic etch to form vertical dielectric spacers 45.

Figure 5:
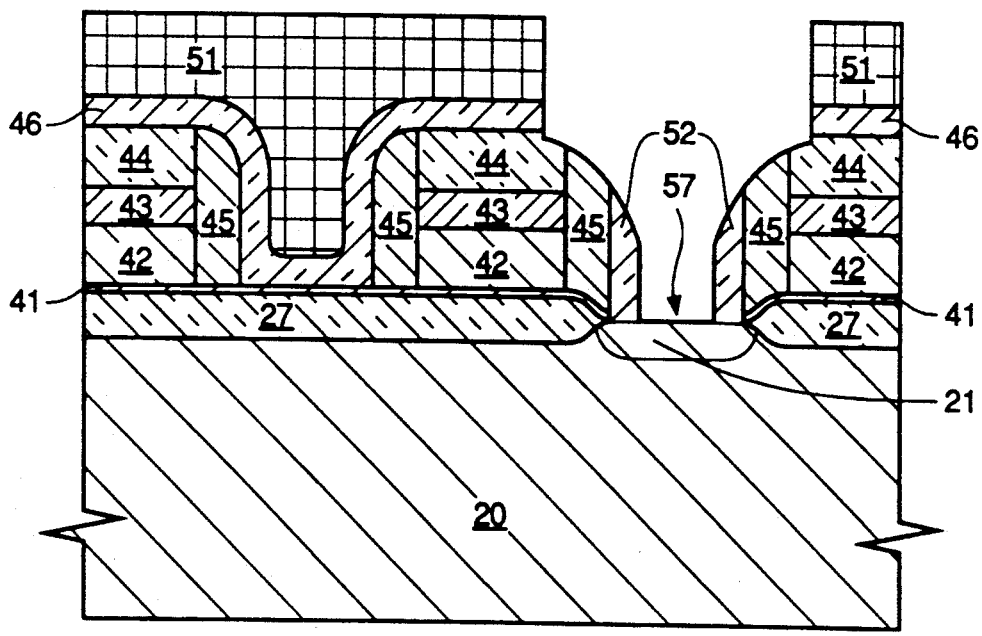
FIG. 5 is a cross-sectional view of the in-process wafer portion of FIG. 4 after conformal dielectric deposition, followed by a buried contact photo and etch.

As shown in FIG. 5, digit lines 42 and their subsequent isolation layers are then covered with dielectric 46 to a preferred thickness of 500 to 2000 angstroms preferably by CVD. Dielectric 46 can be either a layer of oxide or a layer of nitride covered with a layer of oxide. The significance of the type of dielectric 46 chosen will be described later as the dielectric selected can be used to form an alternate storage cell structure also described in this embodiment.

Continuing on with the process steps, a buried contact 57, self-aligned to digit lines 42 by the presence of spacers 45, is located by covering all areas other than contact 57 location with photoresist 51. After applying an appropriate photomask, a buried contact anisotropic etch on the exposed dielectric creates additional spacers 52 and provides an opening to locate contact 57.

FIGS. 6-10 shows the formation of the SCSC seen from a cross-sectional view of parallel word lines 22 to present clearer views of the present invention. Therefore, the invention will be described from here on as seen from the word line cross-section.

Figure 6:
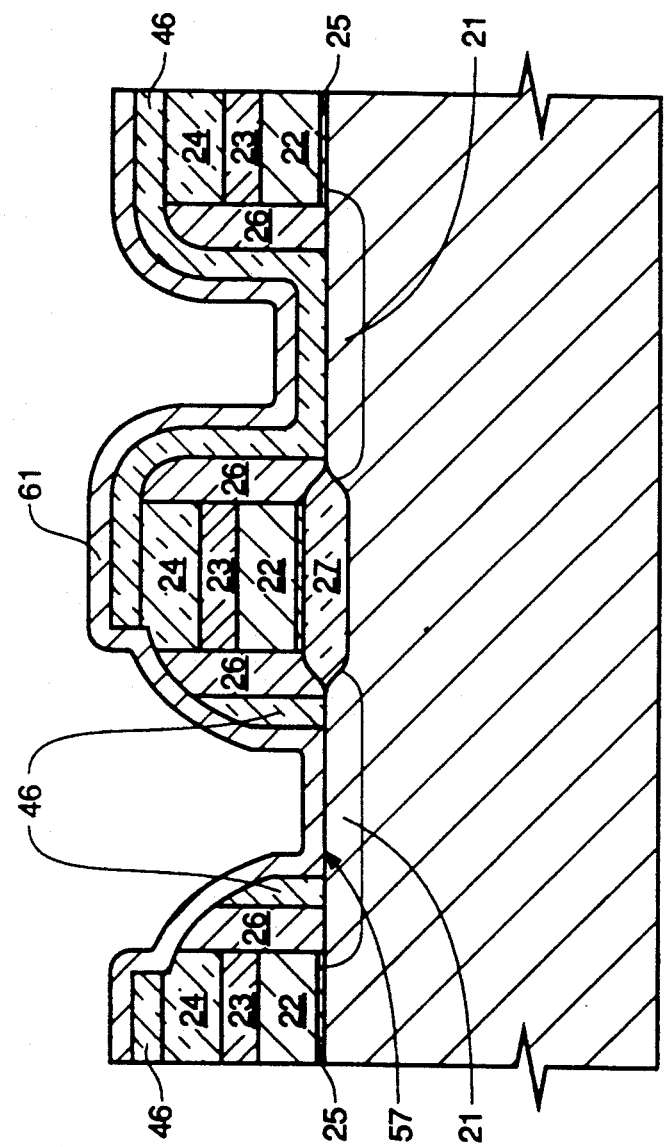
FIG. 6 is a cross-sectional view through broken line C—C, of the in-process wafer portion of FIG. 5 following a photoresist strip, and a blanket deposition of conformal polysilicon.

As shown in FIG. 6, the photoresist 51 (of FIG. 5) has been stripped and a conformal poly layer 61 is deposited, preferably by low temperature deposition, over the entire array surface and couples to active area 21 via buried contact 57. Using low temperature deposition causes poly layer 61 to have a rugged textured surface that potentially doubles the surface area of poly layer 61. Poly 61 extends over an adjacent poly word line 22 and continues to the next adjacent word line. Poly 61 conforms to the two perpendicular waveform-like topology (created after digit line formation) which run in both the word lines and the digit lines directions.

Up to this point, process flow has followed that of an array comprising conventional stacked capacitor cells. From this point forward, the process is unique to an array having SCSC-type storage capacitors.

Figure 7:
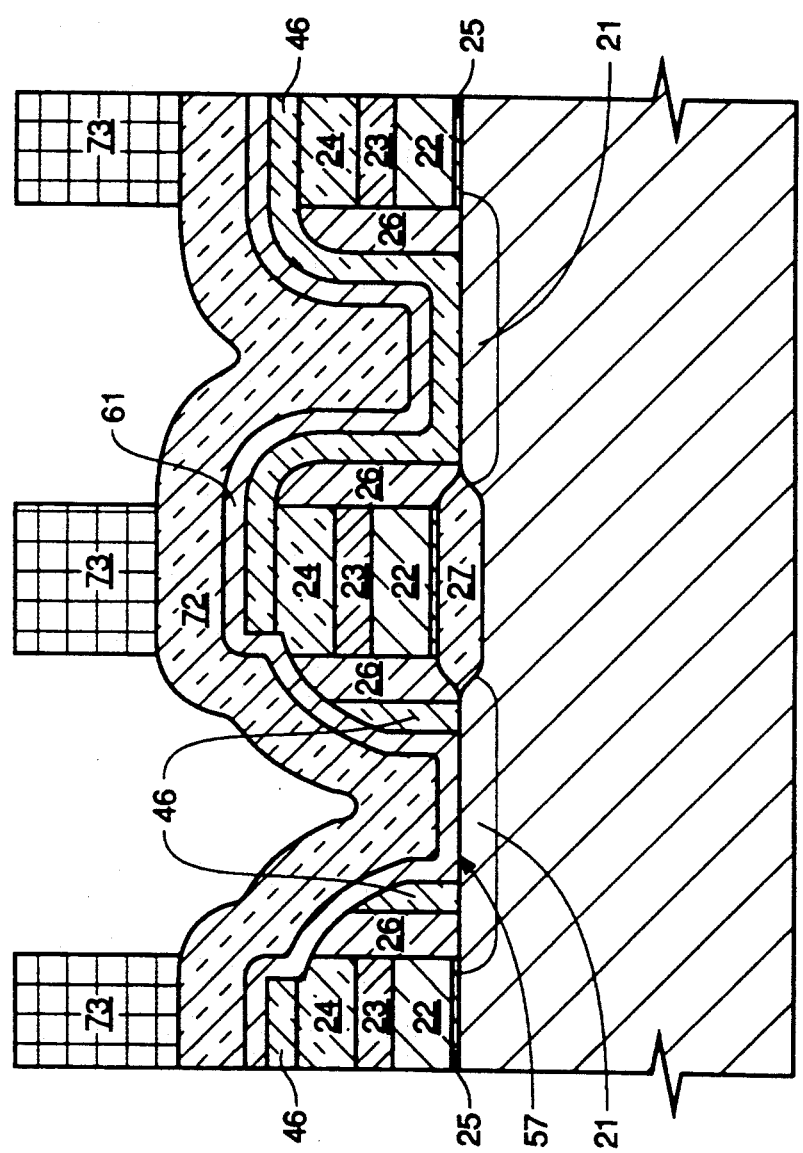
FIG. 7 is a cross-sectional view of the in-process wafer portion of FIG. 6, following deposition of a conformal dielectric.

As shown in FIG. 7, a conformal layer of dielectric film 72 is deposited, preferably an oxide deposited by CVD. A layer of photoresist has been masked and etched to leave strips of resist 73 that will allow patterning of dielectric film 72 that follows.

Figure 8A:
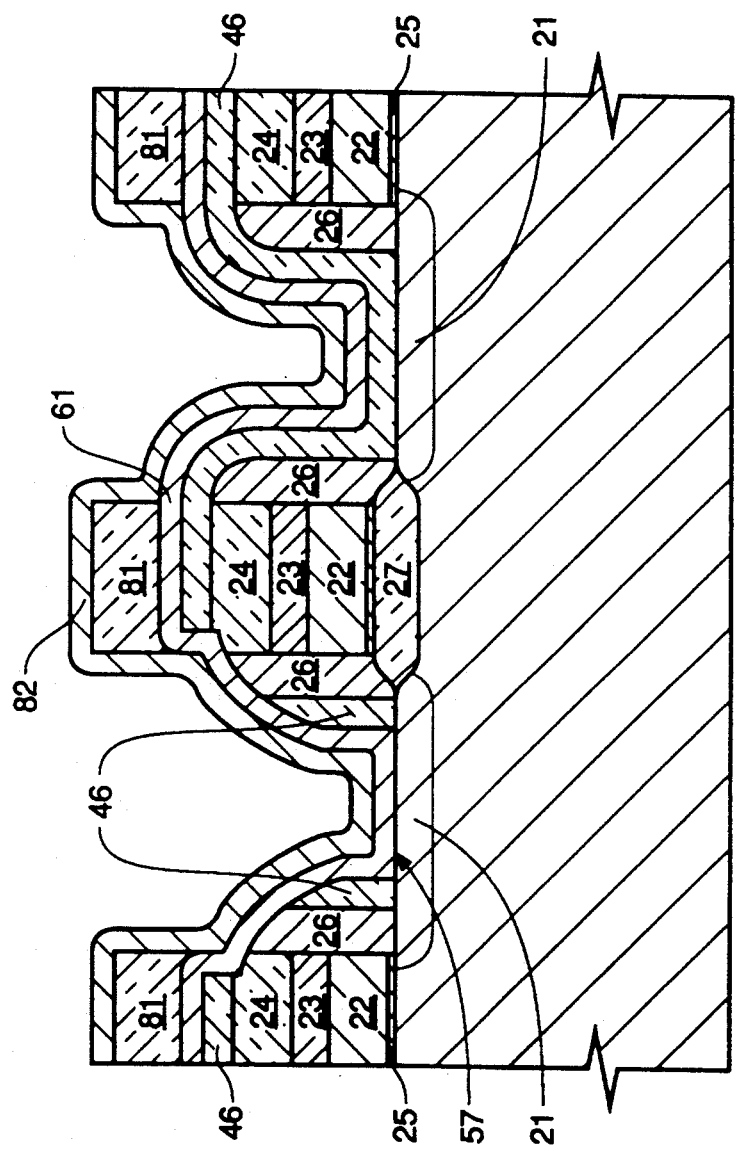
FIGS. 8a and 8b are cross-sectional views of the in-process wafer portion of FIG. 7, after a dielectric patterning and etch, followed by a conformal deposition of polysilicon.
Figure 8B:
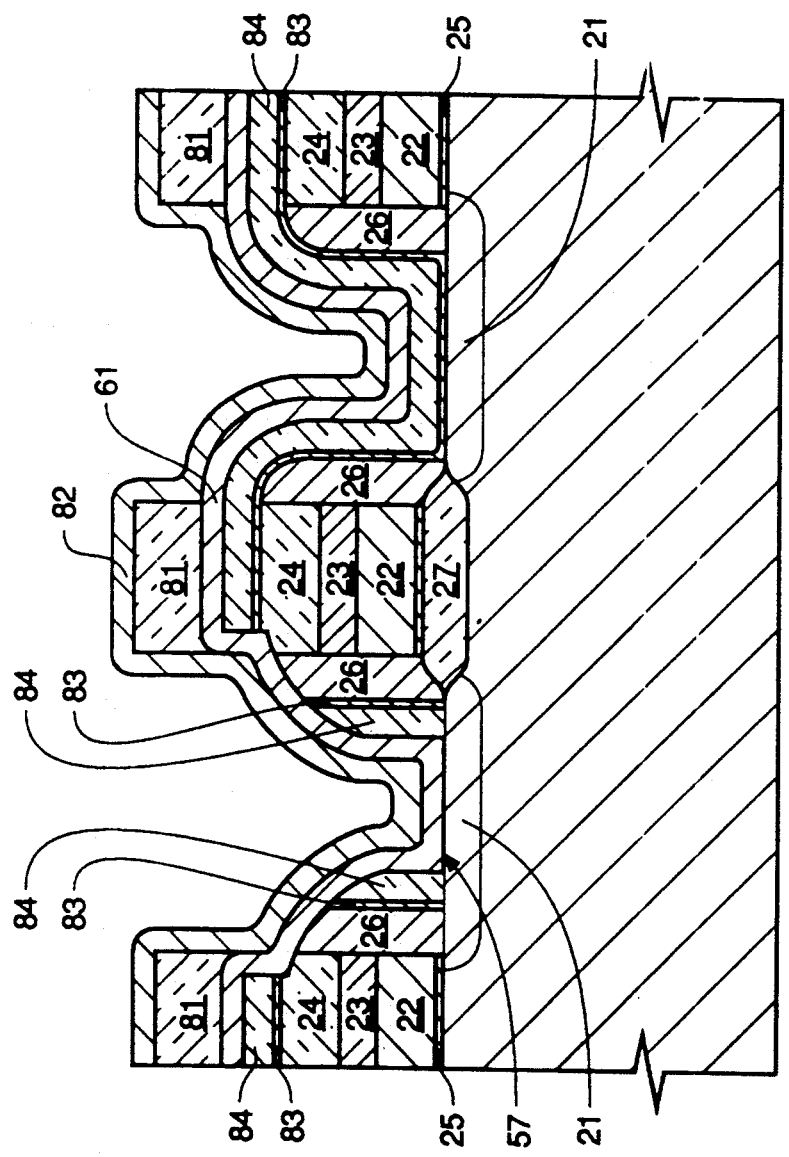

FIG. 8 shows dielectric film 72 having been patterned and etched (preferably an anisotropic etch) to form comb dielectric 81. The number of dielectric elements in comb dielectric 81 formed can be a single element up to a plurality of elements, with the maximum number being limited by photolithography capabilities. For example, if poly 61 is subsequently patterned to be 3 microns in length along the digit line direction, and 0.5 micron photolithography process is used, then a total of 3 dielectric elements could be formed. Of course as a given photolithography process becomes more refined the maximum number of dielectric elements can be increased. Following comb dielectric 81 formation, resist 73 is stripped and a conformal layer of poly 82 is deposited, preferably by low temperature deposition. Once again, low temperature deposition will cause poly 82 to take on a rugged, textured surface, which will increase poly surface area. As mentioned earlier, FIG. 8b shows the alternate process with a word line dielectric 46 being made up of a layer of nitride 83 overlaid with oxide 84. This selection of dielectric being nitride 83 and oxide 84 will allow an appropriate removal of all exposed oxide 84 to expose the backside of poly 61, discussed in the following steps.

Figure 9A:
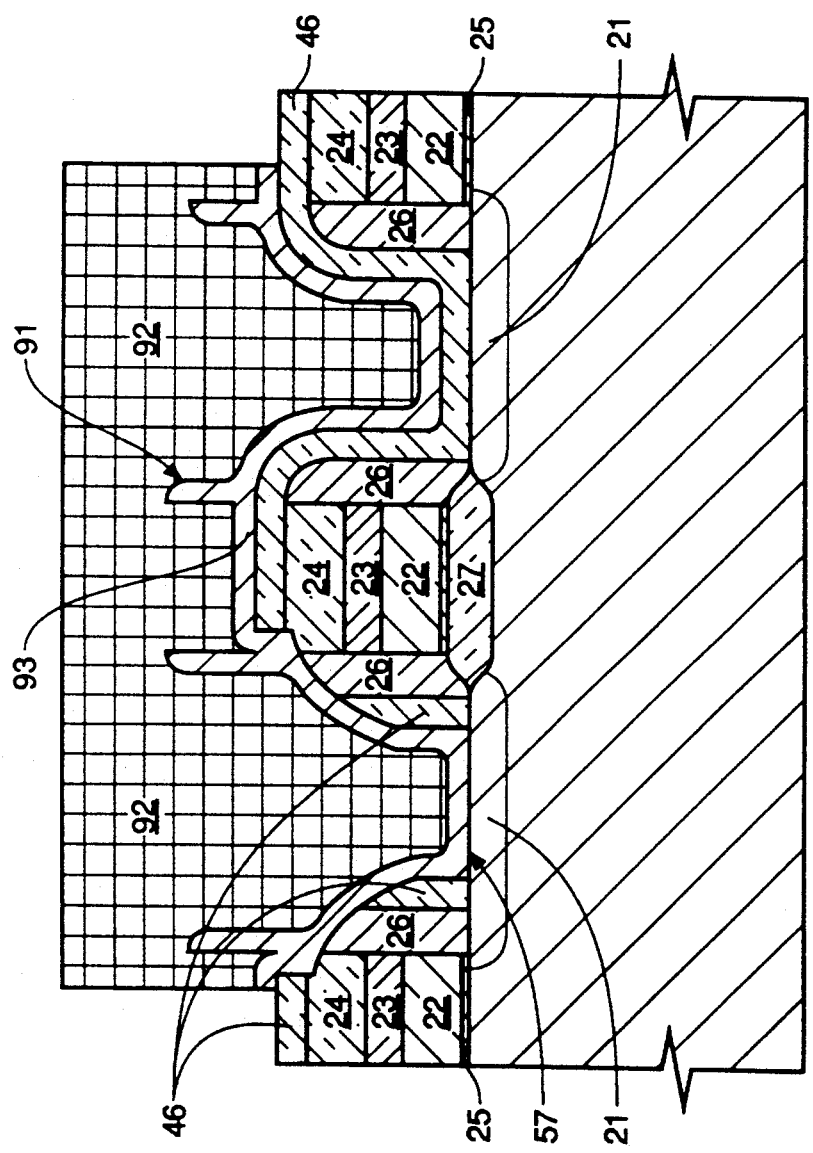
FIG. 9a is a cross-sectional view of the in-process wafer portion of FIG. 8a, after a poly spacer etch followed by removal of a comb dielectric, subsequently followed by masking and etching of a poly storage node cell plate.
Figure 9B:
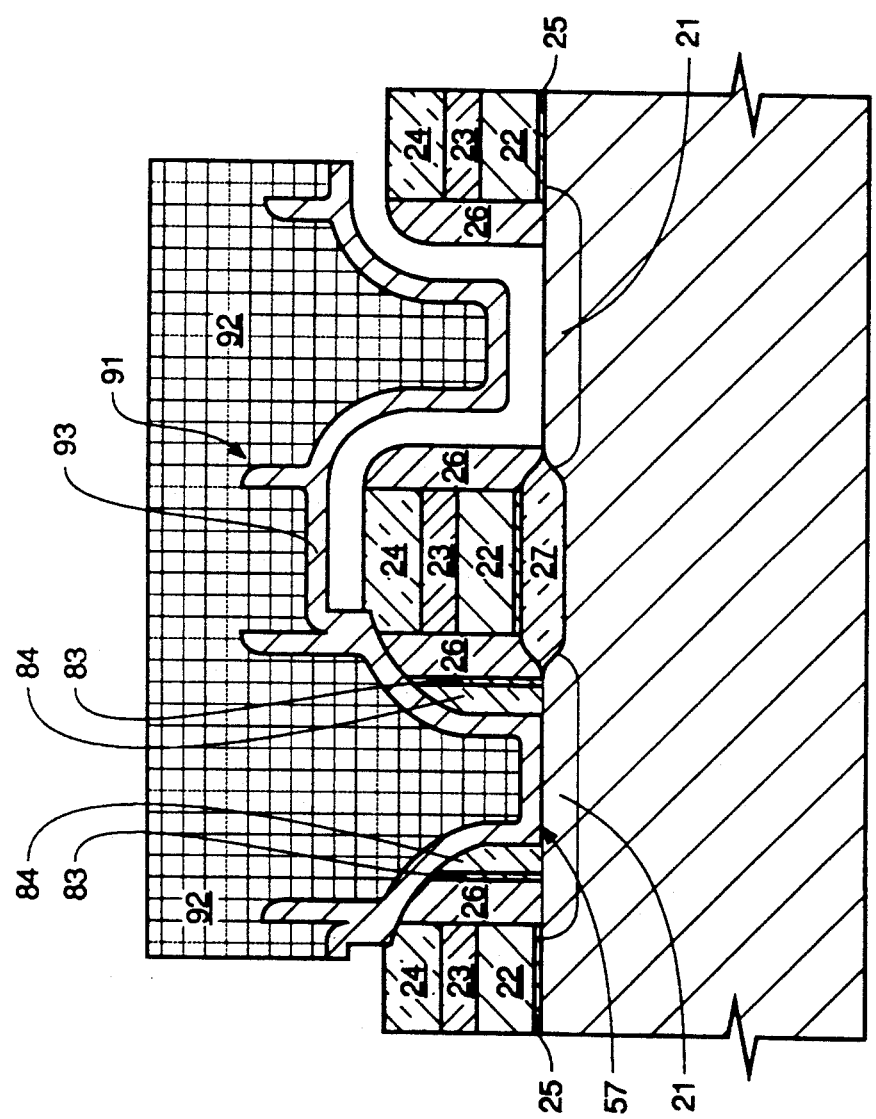
FIG. 9b is a cross-sectional view of the in-process wafer portion of FIG. 8b, after a poly spacer etch followed by removal of a comb dielectric, followed by masking and etching of a poly storage node cell plate, subsequently followed by a dielectric wet etch.

As shown in FIG. 9, poly 82 is anisotropically etched using a dry poly etch to form poly spacer walls 91. Multiple poly spacer walls 91 attach to poly 61 thus extending poly plate 61 in a substantially vertical direction. The sides of the poly spacer walls 91 are available to gain additional capacitance. Also shown, photoresist 92 is deposited followed by etching of poly 61 to form a storage node cell plate 93 of the SCSC. Poly spacer walls 91 create a spiked shaped area attached to the top of the v-shaped cross-section of poly 61 to serve as a completed storage node cell plate 93 of the SCSC cell. The cross-sectional view of storage node cell plate 93 now takes on a comb-shaped appearance. FIG. 9b represents the wafer having gone through the same process steps as FIG. 9a with the exception of an additional wet dielectric etch. In this case, the selection of the word line spacer dielectric is the combination of nitride 83 overlaid with oxide 84. A selective wet oxide etch is preformed to remove exposed oxide 84 leaving nitride 83 thereby exposing the backside of poly plate 93.

Figure 10A:
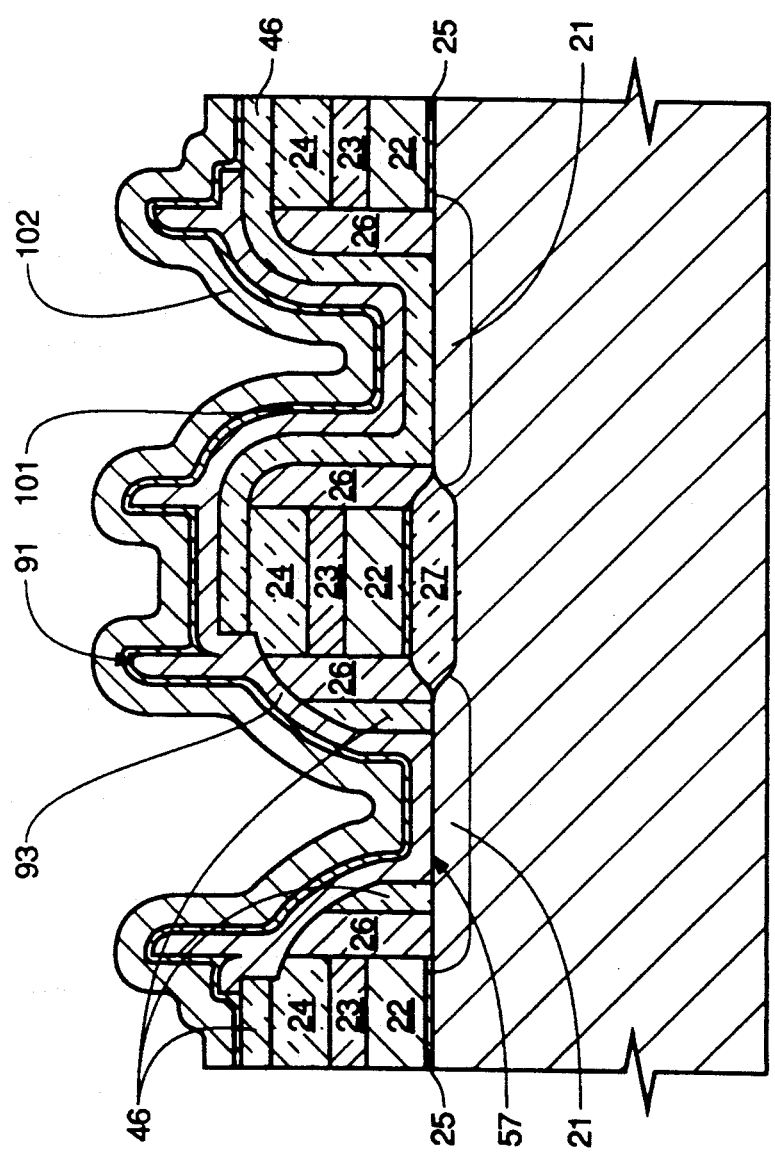
FIGS. 10a and 10b are cross-sectional views of the in-process wafer portion of FIGS. 9a and 9b respectively, following depositions of conformal nitride and poly.
Figure 10B:
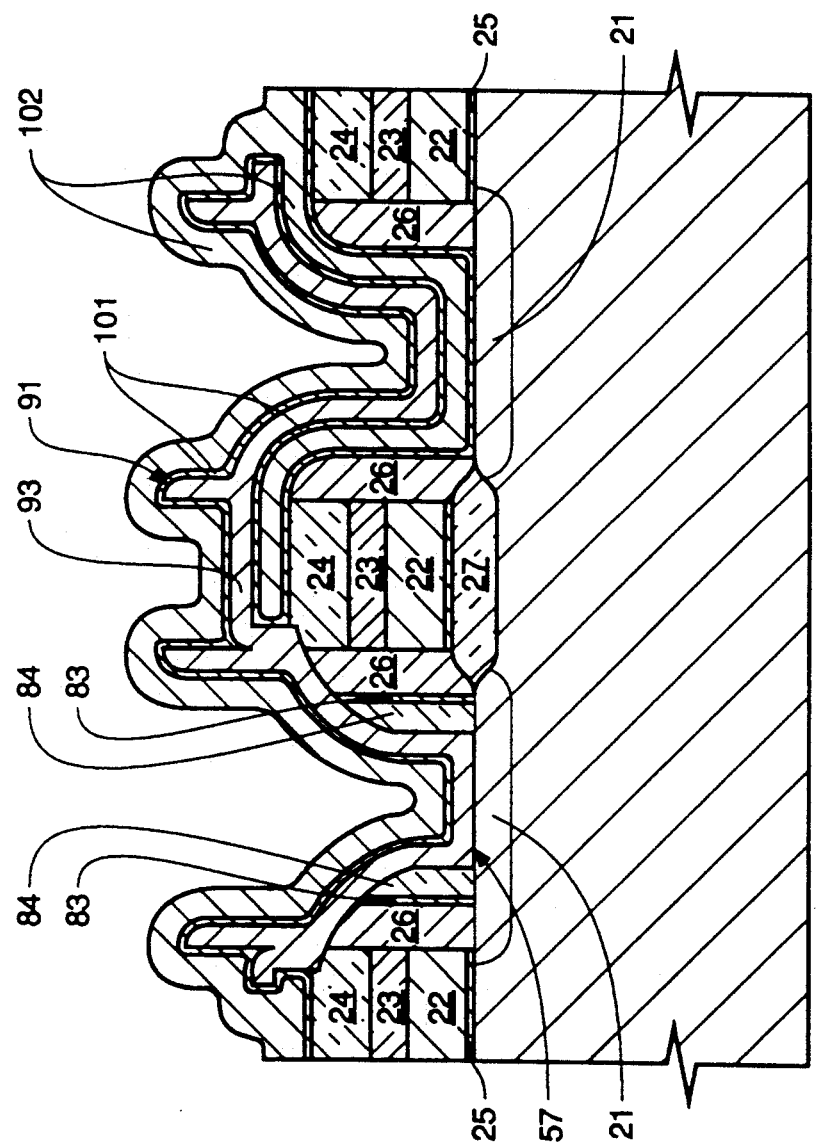

As shown in FIG. 10, a dielectric layer of nitride 101 is deposited that conforms to poly storage node cell plate 92. Nitride 101 serves as a capacitor dielectric for the SCSC cell. Following nitride 101 deposition, a blanket deposition of conformal poly 102 is deposited. Poly plate 101 and poly 102 are conductively doped either n-type or p-type depending on the conductivity type desired for active area 21. Poly 102 now serves as a top poly capacitor cell plate of the SCSC storage capacitor which also becomes a common cell plate to all SCSC storage capacitors in the array. FIG. 10b shows an alternate storage capacitor structure with poly 102 also being deposited in the area under the backside of plate 93, separated by nitride 101. The backside of plate 93 becomes available by the removal of oxide 84.

With the enhanced development of poly storage node plate 101 by the addition of poly spacer walls 91 substantial capacitor plate surface area is gained at the storage node. Since capacitance is mainly effected by the surface area of a capacitor's cell plates the additional area gained by a 3-dimensional SCSC structure can provide an additional 50% increase in capacitance over that of a conventional STC capacitor, without more space than that required for defining a stacked capacitor storage cell. Also, from the alternate process steps that exposes the backside of plate 93 the overall capacitance can be increased by another 50% or more. By using rugged poly as the storage node plate, overall capacitance of both storage capacitor structures described in this embodiment, can be increased by an additional 100%.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:
   creating a plurality of separately isolated active areas arranged in parallel interdigitated rows and parallel non-interdigitated columns;
   creating a gate dielectric layer on top of each active area;
   depositing a first conductive layer superjacent surface of said array;
   depositing a first dielectric layer superjacent said first conductive layer;
   masking and etching said first conductive and said first dielectric layers to form a plurality of parallel conductive word lines aligned along said rows such that each said word line passes over a inner portion of each said active area being separated therefrom by a remanent of said gate dielectric layer;
   creating of a conductively-doped digit line junction and storage node junction within each said active area on opposite sides of each said word line;
   depositing a second dielectric layer superjacent said array surface;
   creating a first aligned buried contact location at each said digit line junction in each said active area;
   depositing a second conductive layer superjacent said array surface, said second conductive layer making direct contact to said digit line junctions at said first buried contact locations;
   depositing a third dielectric layer superjacent to said second conductive layer;
   masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;
   depositing a first oxide layer superjacent said array surface of said waveform-like topology;
   creating a second aligned buried contact location at each said storage node junction in each said active area;
   depositing a third conductive layer superjacent said array surface assuming said waveform-like topology in response to existing topology, said third conductive layer making contact to said storage node junctions at said second buried contact locations;
   depositing a fourth dielectric layer;
   patterning said fourth dielectric layer to form a comb dielectric running parallel to said word lines;
   depositing a fourth conductive layer conformal to existing topology, said fourth conductive layer attaching to said third conductive layer;
   etching said fourth conductive layer thereby forming vertically spiked polysilicon spacer walls;
   etching said fourth dielectric;
   masking said third and said fourth conductive layers with resist;
   etching exposed area of said third conductive layer, said third conductive layer having a v-shaped cross-section, said third and said fourth conductive layers thereby forming a completed storage node plate having a spiked v-shaped cross-section;

removing said resist;

depositing a cell dielectric layer adjacent and coextensive with said storage node plate and adjacent said array surface; and depositing a fourth conductive layer adjacent to and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first, said second, and said fourth dielectric layers are selected from the group consisting essentially of oxide or nitride.

5. A process as recited in claim 1, wherein said third dielectric layer is oxide.

6. A process as recited in claim 1, wherein said first and said second buried contacts are self aligned.

7. A process as recited in claim 1, wherein said third, said fourth and said fifth conductive layers are doped polysilicon.

8. A process as recited in claim 1, wherein said third and said fourth conductive layers are deposited by low temperature deposition.

9. A process as recited in claim 1, wherein said second, said third, and said fourth dielectric layers are deposited by chemical vapor deposition.

10. A process as recited in claim 1, wherein said cell dielectric layer is nitride.

11. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a fourth dielectric layer superjacent said array surface of said waveform-like topology, said fourth dielectric layer comprising a first nitride layer superjacent to said array surface and a first oxide layer superjacent said first nitride layer;

creating a second aligned buried contact location at each said storage node junction in each said active area;

depositing a third conductive layer superjacent said array surface assuming said waveform-like topology in response to existing topology, said third conductive layer making contact to said storage node junctions at said second buried contact locations;

depositing a fifth dielectric layer;

patterning said fifth dielectric layer to form a comb dielectric running parallel to said word lines;

depositing a fourth conductive layer conformal to existing topology, said fourth conductive layer attaching to said third conductive layer;

etching said fourth conductive layer thereby forming vertically spiked polysilicon spacer walls;

etching said fifth dielectric;

masking said third and said fourth conductive layers with resist;

etching exposed area of said third conductive layer, said third conductive layer having a v-shaped cross-section, said third and said fourth conductive layers thereby forming a completed storage node plate having a spiked v-shaped cross-section;

removing said resist;

etching said first oxide layer of said fourth dielectric layer thereby exposing a backside of said storage node cell plate;

depositing a cell dielectric layer adjacent and coextensive with said storage node plate and adjacent said array surface; and depositing a fourth conductive layer adjacent to and coextensive with said cell dielectric layer to form a cell plate common to the entire memory array.

12. A process as recited in claim 11, wherein said gate dielectric layer is oxide.

13. A process as recited in claim 11, wherein said first and said second conductive layers comprise a layer of tungsten silicide and doped polysilicon.

14. A process as recited in claim 11, wherein said first, said second, and said fifth dielectric layers are selected from the group consisting essentially of oxide or nitride.

15. A process as recited in claim 11 wherein said third dielectric layer is oxide.

16. A process as recited in claim 11, wherein said first and said second buried contacts are self aligned.

17. A process as recited in claim 11, wherein said third, said fourth and said fifth conductive layers are doped polysilicon.

18. A process as recited in claim 11, wherein said third and said fourth conductive layers are deposited by low temperature deposition.

19. A process as recited in claim 11, wherein said second, said third, and said fourth dielectric layers are deposited by chemical vapor deposition.

20. A process as recited in claim 11, wherein said cell dielectric layer is nitride.

* * * * *